United States Patent
Bandic et al.

(10) Patent No.: US 10,078,646 B2
(45) Date of Patent: *Sep. 18, 2018

(54) HARDWARE EFFICIENT FINGERPRINTING

(71) Applicant: HGST Netherlands B.V., Amsterdam (NL)

(72) Inventors: Zvonimir Bandic, San Jose, CA (US); Cyril Guyot, San Jose, CA (US); Dongyang Li, Kingston, RI (US); Ashwin Narasimha, Los Altos, CA (US); Qingbo Wang, Irvine, CA (US); Ken Yang, Saunderstown, RI (US)

(73) Assignee: HGST Netherlands B.V., Amsterdam (NL)

( * ) Notice: Subject to any disclaimer, the term of this patent is extended or adjusted under 35 U.S.C. 154(b) by 486 days.

This patent is subject to a terminal disclaimer.

(21) Appl. No.: 14/835,622

(22) Filed: Aug. 25, 2015

(65) Prior Publication Data

US 2016/0224595 A1 Aug. 4, 2016

Related U.S. Application Data

(60) Provisional application No. 62/109,524, filed on Jan. 29, 2015.

(51) Int. Cl.
*G06F 17/30* (2006.01)
*H03M 7/30* (2006.01)

(52) U.S. Cl.
CPC .. *G06F 17/30303* (2013.01); *G06F 17/30371* (2013.01); *H03M 7/3091* (2013.01); *H03M 7/3093* (2013.01); *H03M 7/6029* (2013.01)

(58) Field of Classification Search
None
See application file for complete search history.

(56) References Cited

U.S. PATENT DOCUMENTS

| 9,244,623 B1* | 1/2016 | Bent ............... G06F 3/0641 |
| 9,400,610 B1* | 7/2016 | Wallace .......... G06F 3/0652 |
| 2007/0208703 A1 | 9/2007 | Shi et al. |

(Continued)

OTHER PUBLICATIONS

Li, Dongyang et al., "A Parallel and Pipelined Architecture for Accelerating Fingerprint Computation in High Throughput Data Storages" dated May 2-6, 2015, 6 pages, 2015 IEEE 23rd Annual International Symposium.

*Primary Examiner* — Belix M Ortiz Ditren
(74) *Attorney, Agent, or Firm* — Patent Law Works LLP

(57) ABSTRACT

An approach for fingerprinting large data objects at the wire speed has been disclosed. The techniques include Fresh/Shift pipelining, split Fresh, optimization, online channel sampling, and pipelined selection. The architecture can also be replicated to work in parallel for higher system throughput. Fingerprinting may provide an efficient mechanism for identifying duplication in a data stream, and deduplication based on the identified fingerprints may provide reduced storage costs, reduced network bandwidth consumption, reduced processing time and other benefits. In some embodiments, fingerprinting may be used to ensure or verify data integrity and may facilitate detection of corruption or tampering. An efficient manner of generating fingerprints (either via hardware, software, or a combination) may reduce a computation load and/or time required to generate fingerprints.

18 Claims, 11 Drawing Sheets

(56) References Cited

U.S. PATENT DOCUMENTS

2009/0024826 A1* 1/2009 Zhang .................... G06F 7/724
 711/216
2015/0010143 A1* 1/2015 Yang ....................... G09C 1/00
 380/28
2017/0270135 A1* 9/2017 Lambright ........ G06F 17/30159

* cited by examiner $p(X) = X^{16} + X^{15} + X^{12} + X^{10} + X^9 + X^8 + X^4 + X^2 + 1$

- 261 XORs
- Fan-in 23
- Fan-out 11

HARDWARE EFFICIENT FINGERPRINTING

CROSS REFERENCE TO RELATED APPLICATIONS

This application claims priority, under 35 U.S.C. § 119, to U.S. Provisional Patent Application No. 62/109,524, filed Jan. 29, 2015 entitled "Methods and Systems for More Efficient Rabin Fingerprinting," which is incorporated herein by reference in its entirety.

BACKGROUND

The present disclosure relates to hardware efficient fingerprinting. In particular, the present disclosure relates to a pipelined hardware architecture for computing fingerprints on high throughput data.

As data increases rapidly, identifying and reducing the redundancy in the storage, transmission, and processing of data has become more and more important. One of the common techniques used in identifying redundant data is comparing sketches of data chunks to find duplication or similarity. To illustrate, Rabin fingerprints have proved to be effective and are widely used in the detection of data duplication and similarity. To get a sketch for a data chunk using Rabin fingerprints, the data is scanned using a fixed size window, e.g., 8 bytes long, that rolls one byte ahead every step. The data within the window, called a "shingle," is used to calculate a Rabin fingerprint. This process continues until the chunk of data is finished. During and after the scanning, the fingerprints are sampled to form a sketch for the data chunk. This algorithm is suitable for data de-duplication in off-line data backup and archive applications, but demands intense computation when working at wire speed for streaming data.

With storage devices approaching gigabyte per second throughput and sub-millisecond latency, software approaches to fingerprinting are inadequate for real-time data processing without committing a huge amount of computing power which may impact performance and resource utilization. In view of the foregoing, it may be understood that there may be significant problems and shortcomings associated with current technologies for generating fingerprints and deduplicating data.

SUMMARY

The present disclosure relates to systems and methods for hardware efficient fingerprinting.

Other implementations of one or more of these aspects include corresponding systems, apparatus, and computer programs, configured to perform the actions of the methods, encoded on computer storage devices. It should be understood that the language used in the present disclosure has been principally selected for readability and instructional purposes, and not to limit the scope of the subject matter disclosed herein.

BRIEF DESCRIPTION OF THE DRAWINGS

The present disclosure is illustrated by way of example, and not by way of limitation in the figures of the accompanying drawings in which like reference numerals are used to refer to similar elements.

FIG. 3 illustrates an example irreducible polynomial, p(x), for use in generating Rabin fingerprints and a set of example equations that result in the fingerprints, according to the techniques described herein.

DETAILED DESCRIPTION

Figure 1:
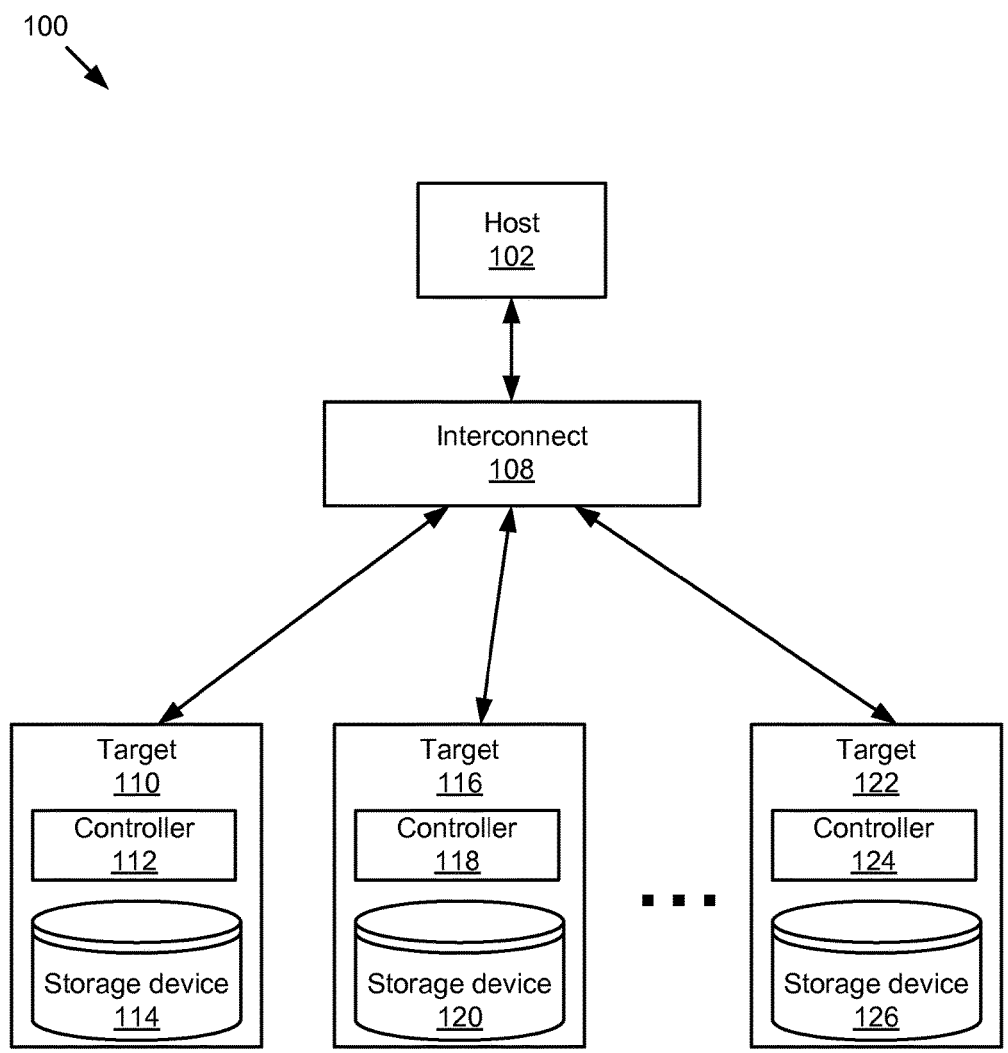
FIG. 1 is a high-level block diagram illustrating an example system including a host, an interconnect, and a number of targets.

Systems and methods for implementing a pipelined hardware architecture for computing fingerprints on high throughput streaming data are described below. While the systems, methods of the present disclosure are described in the context of a particular system architecture, it should be understood that the systems, methods and interfaces can be applied to other architectures and organizations of hardware.

Rabin fingerprinting may effectively provide unique signatures or fingerprints to identify duplicate or similar portions of a data chunk. Rabin fingerprints may be generated using a randomly chosen polynomial (p). Given an n-bit message (e.g., m=$m_0, m_1, \ldots, m_{n-1}$), the message may be represented as a polynomial of degree n−1 over the finite field GF(2). A random polynomial p(x) of degree k over GF(2) is then selected, and the fingerprint of the message m is defined to be the remainder after division of f(x) by p(x) over GF(2), which can be viewed as a polynomial of degree k−1 or as a k-bit number. When p(x) is irreducible, two qualities make Rabin fingerprints a good candidate to bin various messages: 1) if two messages are equal, then they will generate the same fingerprints; 2) if two messages are different, the probability that those messages give the same fingerprint is low (e.g., close to $2^{-k/2}$). However, in some embodiments, randomly choosing an irreducible polynomial may not be practical. Particularly, finding a random irreducible polynomial may not be a trivial task in hardware. In some embodiments, a polynomial may be selected that satisfies a few criteria and it may be reused multiple times. The criteria may include: 1) ensuring that collisions for real-world data are as rare as can reasonably be expected; and 2) representation of polynomial leads to efficient implementation based on optimization with respect to a) the number of operations required for fingerprint generation; b) reducing fan-in operations or gates required for fingerprint generation; and c) reducing fan-out operations or gates required for fingerprint generation.

In some embodiments, the techniques may be realized as a method for improving the generation of fingerprinting for efficient deduplication, data integrity verification and security, and other purposes. According to some embodiments, fingerprints may be produced by specialized hardware. A hardware fingerprinting module or component may be implemented in a system to obtain signatures of an incoming data stream. To ensure that fingerprint generation is capable of keeping up with a data stream, an optimized pipelined architecture can be created for a selected polynomial (the selected polynomial used for generation of Rabin fingerprints), which can reduce resource consumption for the design and/or balance resource allocation among one or more pipeline states. This may provide better overall system performance. Fingerprinting may provide an efficient mechanism for identifying duplication in a data stream, and deduplication based on the identified fingerprints may provide reduced storage costs, reduced network bandwidth consumption, reduced processing time and other benefits. In some embodiments, fingerprinting may be used to ensure or verify data integrity and may facilitate detection of corruption or tampering. An efficient manner of generating fingerprints (either via hardware, software, or a combination) may reduce a computation load and/or time required to generate fingerprints. While the examples herein are directed to Rabin fingerprints, some of the techniques disclosed herein apply also to other types of cyclic redundancy checks and fingerprint computations as well.

FIG. 1 is a high-level block diagram illustrating an example system 100 including a host 102, an interconnect 108, and a number of targets 110, 116, and 122. The host system 102 can take any suitable form, such as, but not limited to, an enterprise server, a database host, a workstation, a personal computer, a mobile phone, a game device, a personal digital assistant (PDA), an email/text messaging device, a digital camera, a digital media (e.g., MP3) player, a GPS navigation device, a TV system, or the like.

The host system 102 may be communicatively coupled with the targets 110, 116, and 122 through an interconnect 108 and/or a network (not shown). For example, the interconnect 108 may be a PCI express (PCIe) switch and may couple the targets 110, 116, and 122 with the host 102 via a PCIe root complex within the host. Similarly, the interconnect may be a host bus adapter (HBA) that connects the host 102 with targets 110, 116, and 122 via SCSI, Fibre Channel, SAS, SATA, eSATA, or the like. In the example of FIG. 1, targets 110, 116, and 122 may be any suitable PCIe compatible device, for example, a Non-Volatile Memory express (NVMe) based target. Targets 110, 116, and 122 may each contain respective NVMe controllers 112, 118, and 124, and respective non-volatile storage devices 114, 120, and 126.

According to some embodiments, interface standards other than PCIe may be used for one or more portions of the link between the host 102 and the targets 110, 116, and 122. For example, the links may include, but are not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS), or any other suitable interface standard or combination of interface standards.

The host system 102 and the target device can include additional components, which are not shown in FIG. 1 to simplify the drawing. Also, in some embodiments, not all of the components shown are present. Further, the various controllers, blocks, and interfaces can be implemented in any suitable fashion. For example, a controller can take the form of one or more of, for example, a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller.

Figure 2A:
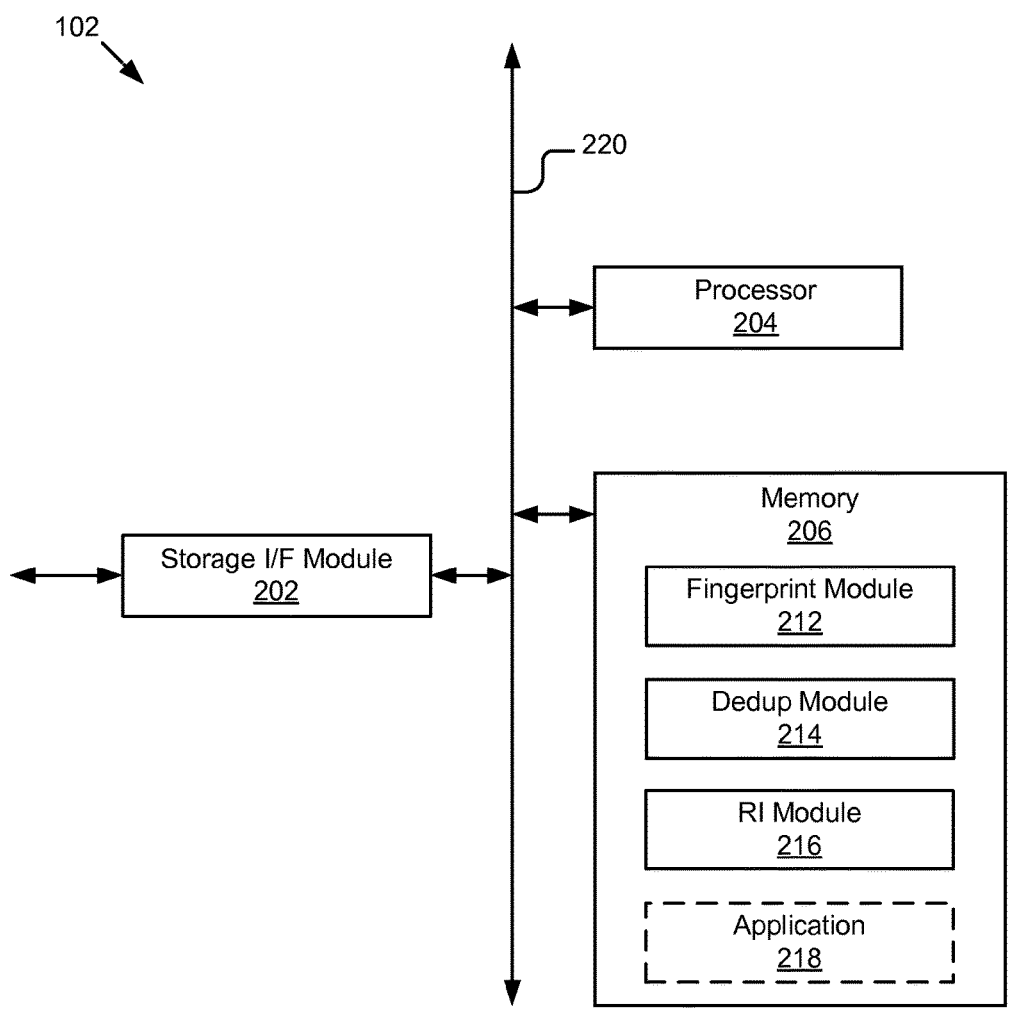
FIG. 2A is a block diagram illustrating an example host configured to implement techniques introduced herein.

FIG. 2A is a block diagram illustrating an example host 200 configured to implement the techniques introduced here. In the example of FIG. 2A, the host 102 includes a storage interface (I/F) module 202, a processor 204, and a memory 206. The components of the host 102 are communicatively coupled to a bus or software communication mechanism 220 for communication with each other.

The storage interface module 202, as described above, is configured to connect host 102 with targets 110, 116, and 122. For example, the storage interface module 202 may be a PCIe root complex, or the like for sending and/or receiving data from targets 110, 116, and 122.

The processor 204 may include an arithmetic logic unit, a microprocessor, a general purpose controller or some other processor array to perform computations. In some implementations, the processor 204 is a hardware processor having one or more processing cores. The processor 204 is coupled to the bus 220 for communication with the other components. Processor 204 processes data signals and may include various computing architectures including a complex instruction set computer (CISC) architecture, a reduced instruction set computer (RISC) architecture, or an architecture implementing a combination of instruction sets. Although only a single processor is shown in the example of FIG. 2A, multiple processors and/or processing cores may be included. It should be understood that other processor configurations are possible.

The memory 206 stores instructions and/or data that may be executed by the processor 204. In the illustrated implementation, the memory 206 includes a fingerprint module 212, a deduplication module 214, a reference indexing module 216, and an application 218. The memory 206 is coupled to the bus 220 for communication with the other components of the host 102. The instructions and/or data stored in the memory 206 may include code for performing any and/or all of the techniques described herein. The memory 206 may be, for example, non-transitory memory such as a dynamic random access memory (DRAM) device, a static random access memory (SRAM) device, flash memory or some other memory devices. The memory may further include a file system (not shown) to provide file level data storage and retrieval for the application 218. Additionally, the memory may include a block level driver (not shown) to provide block level data access to a target storage device couple to the host 102 via the storage interface module 202.

The fingerprint module 212 may be configured to compute fingerprints for data blocks according to the techniques disclosed herein. Reference indexing module 216 may access, store, generate, and manage a reference block list with a signature field containing reference fingerprints generated from the reference blocks. Using fingerprints of incoming data blocks, reference indexing module 216 searches for a reference block that matches or is similar to the incoming data block that can be used by the deduplication module for compression of the incoming data block. The deduplication module 214 compares incoming data blocks to indexed reference blocks with matching or similar fingerprints to compress and/or eliminate duplicate data in the incoming data blocks. In one embodiment, if an incoming data block is identical to an existing reference block, the deduplication module 214 stores a reference to the existing data and not the new data itself. In another embodiment, if a new data block is similar to an existing reference block, the deduplication module stores only a delta showing the difference between the data from which the new fingerprint is generated and an existing reference data block from which the existing indexed fingerprint is generated.

Figure 2B:
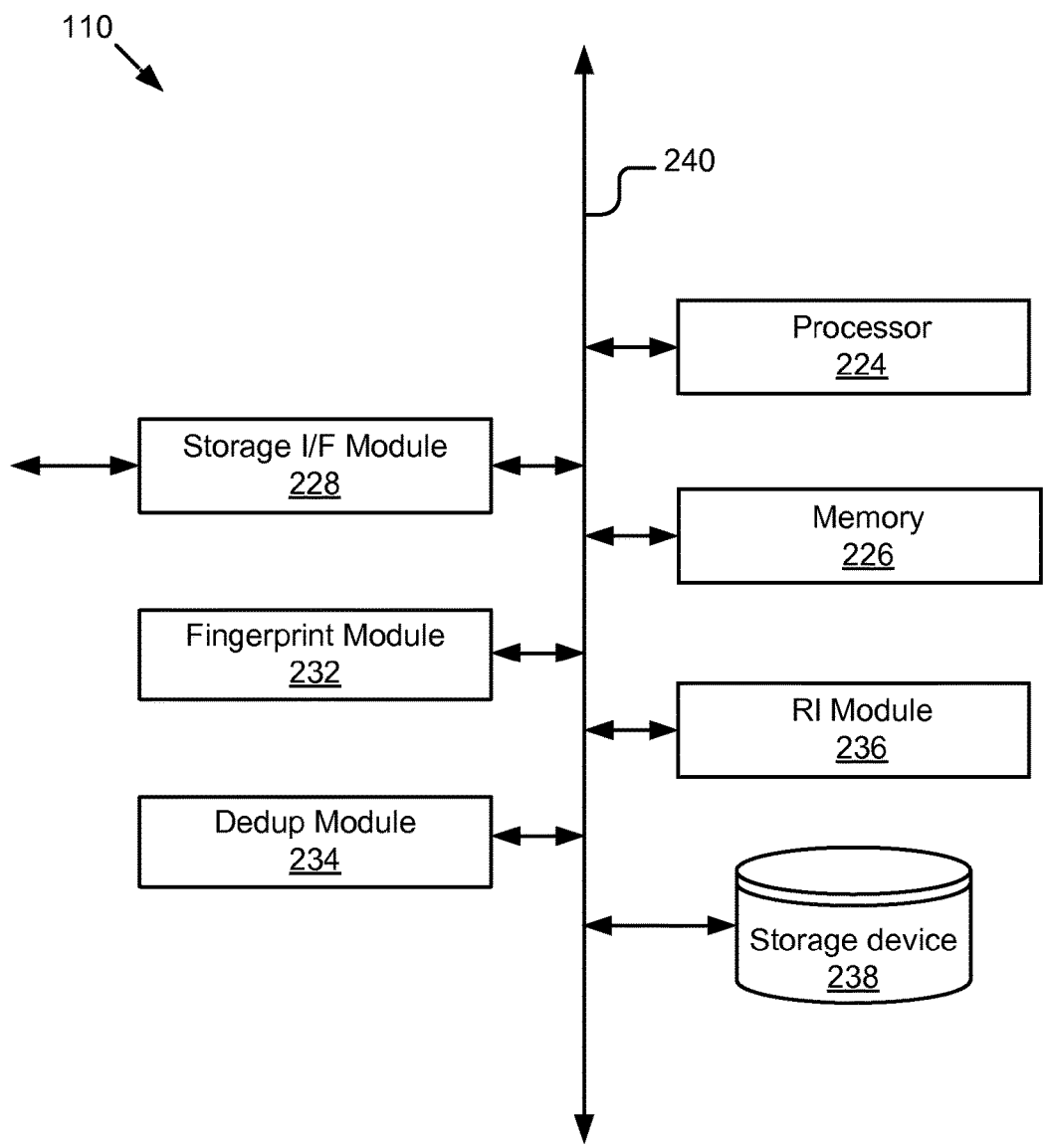
FIG. 2B is a block diagram illustrating an example target configured to implement techniques introduced herein.

FIG. 2B is a block diagram illustrating an example target (e.g., target 110) configured to implement the techniques introduced here. In the example of FIG. 2B, the target 110 includes a storage interface (I/F) module 228, a processor 224, a memory 226, a fingerprint module 232, a reference indexing module 236, a deduplication module 234, and a storage device 238. The components of the target 110 are communicatively coupled to a bus or software communication mechanism 240 for communication with each other. The modules in the example of FIG. 2B may operate as described above with reference to the example of FIG. 2A except that in FIG. 2B, the modules may be implemented in hardware, e.g., on a field programmable gate array (FPGA), an application specific integrated circuit (ASIC), or the like. While depicted in the example of FIG. 2B as distinct modules, it should be understood that one or more of the modules may be implemented on the same hardware or various hardware devices.

Figure 3:
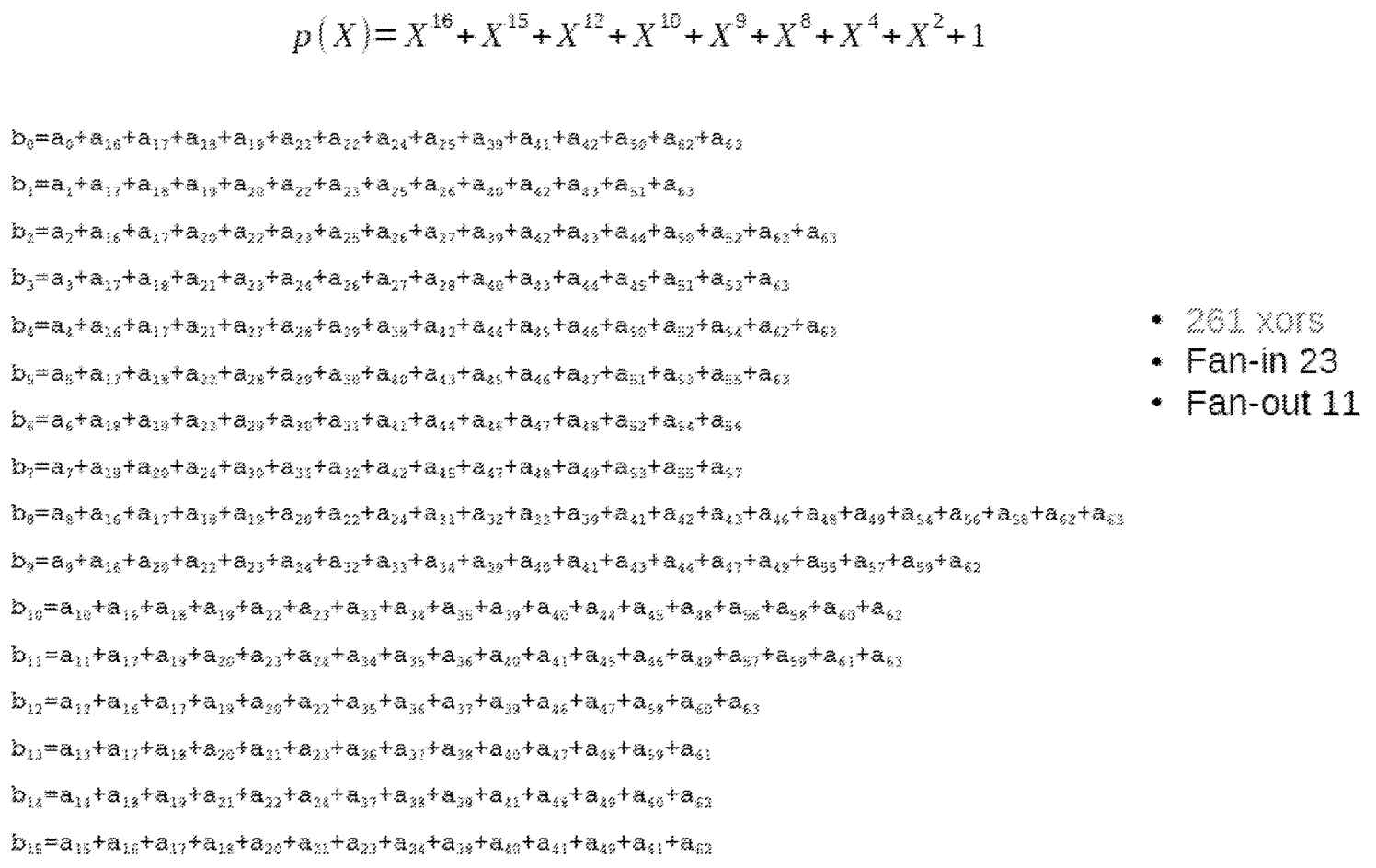

In some embodiments, the fingerprint module processes multiple bits in one clock cycle to provide fingerprinting for high data rate applications. Using formal algebra, a single modulo operation (e.g., determining a Rabin fingerprint) can be turned into multiple calculations, each of which is responsible for one bit in the result. In the following examples, we assume the data string is 64 bits resulting in 16-bit Rabin fingerprints. FIG. 3 illustrates an example irreducible polynomial, p(x), for use in generating Rabin fingerprints and a set of 16 equations obtained using formal algebra that result in the fingerprints. In the example of FIG. 3, $(a_0, a_1, \ldots, a_{63})$ represents the input bits and $(b_0, b_1, \ldots, b_{15})$ the Rabin fingerprint output.

In one embodiment, to implement one of these equations in hardware, a combinatorial circuit may be used to computer an exclusive-OR (XOR) all of the corresponding input bits. The combination of these 16 circuits is referred to herein as a Fresh function. For the Fresh function in the example of FIG. 3, the maximum fan-in is 23, and maximum fan-out is 11, and the number of XORs is 261. Among 4080 irreducible polynomials of degree 16, the minimum number of XORs is 261, the minimum maximum fan-in 19, and the minimum maximum fan-out 8. So, when permitted by system design requirements, picking a polynomial presents an optimization opportunity for the hardware design of the Fresh function. Such a scheme is suitable for hardware implementation.

Figure 4:
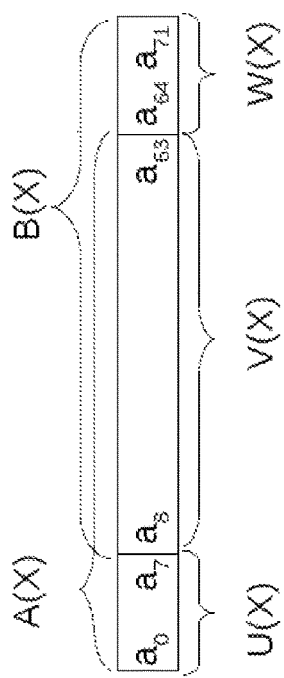
FIG. 4 is a graphic representation of shingles in a data stream, according to the techniques described herein.

For applications of higher data rate, Rabin fingerprint computations are applied to all "shingles." An example of these shingles is shown in FIG. 4. FIG. 4 depicts shingles in a data stream from $a_0$ to $a_{71}$, where (X) is the first shingle, and (X) is the second shingle. While the example of FIG. 4 depicts a shift of one byte, shingles can shift in various other multiples of bits. In one embodiment, to treat all of the shingles in real-time, the Fresh function may be replicated over each shingle. However, it is evident that overlapping computations occur in this scheme. The relation between the Rabin fingerprints of A and B can be calculated as:

$$B \bmod P = (V + W \cdot X^{56}) \bmod P$$
$$B \bmod P = ((U - U) \cdot (X^{-8} \bmod P) + V + W \cdot X^{56}) \bmod P$$
$$B \bmod P = (-U \cdot (X^{-8} \bmod P)) \bmod P +$$
$$((X^{-8} \bmod P) \cdot (U + V \cdot X^{8})) \bmod P + (W \cdot X^{56}) \bmod P$$
$$B \bmod P = (W \cdot X^{56} - U \cdot (X^{-8} \bmod P)) \bmod P +$$
$$((X^{-8} \bmod P) \cdot (U + V \cdot X^{8})) \bmod P$$
$$B \bmod P = (W \cdot X^{56} - U \cdot (X^{-8} \bmod P)) \bmod P +$$
$$((X^{-8} \bmod P) \cdot (U + V \cdot X^{8}) \bmod P) \bmod P$$
$$\text{Let } x^{-8} = X^{-8} \bmod P$$
$$B \bmod P = (W \cdot X^{56} - U \cdot x^{-8}) \bmod P + (x^{-8} \cdot A \bmod P) \bmod P$$

As can be seen, the fingerprint of the new shingle B(x) is dependent on the fingerprint of the old shingle A(x), the first byte of the old shingle U(x), and the first byte of incoming data W(x), which is the last byte of the new shingle B(x). Thus, the fingerprint calculation of each shingle can be optimized using the fingerprint calculation of the previous shingle.

Figure 5:
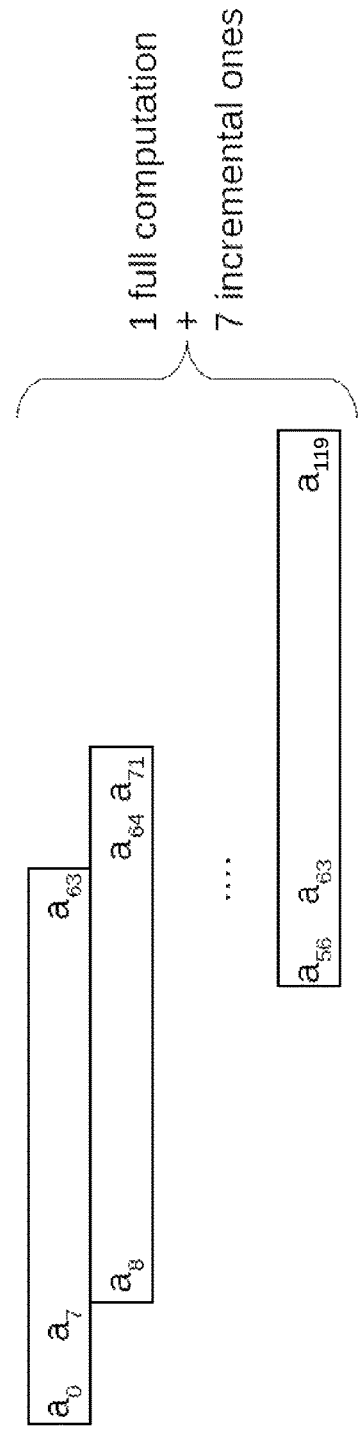
FIG. 5 is a graphic representation of an incremental computation pipeline design, according to the techniques described herein.

Using a 64-bit wide data bus and a 64-bit shingle as an example, an incremental computation pipeline design is illustrated in FIG. 5. The data is drawn from two consecutive clock cycles, for example $(a_0, a_1, \ldots, a_{63})$ from the preceding cycle and $(a_{64}, a_{65}, \ldots, a_{127})$ from the following cycle.

In some embodiments, the techniques disclosed herein include finding an irreducible polynomial for which Rabin fingerprint computation has the least amount of operations for one full computation and several incremental computations of a multiple byte data shingle to group the data in a stream (e.g., seven incremental computations for an eight byte data shingle). The techniques further include computing a Rabin fingerprint incrementally using the selected irreducible polynomial. For example, incremental computation may allow computation of a fingerprint to reuse calculations results from a previous fingerprint calculation of eight bytes. As an example, the fingerprint calculation may calculate the fingerprint of all eight bytes numbered zero to seven, and may shift one byte to the right for a next clock cycle. On the next clock cycle the calculations for bytes zero to seven may be reused and the calculations involving byte eight, and byte zero may be performed. Thus, the fingerprint for the shingle of bytes one to eight may be performed incrementally, reusing the calculations of the prior fingerprint for eight bytes and performing new calculations.

Figure 6:
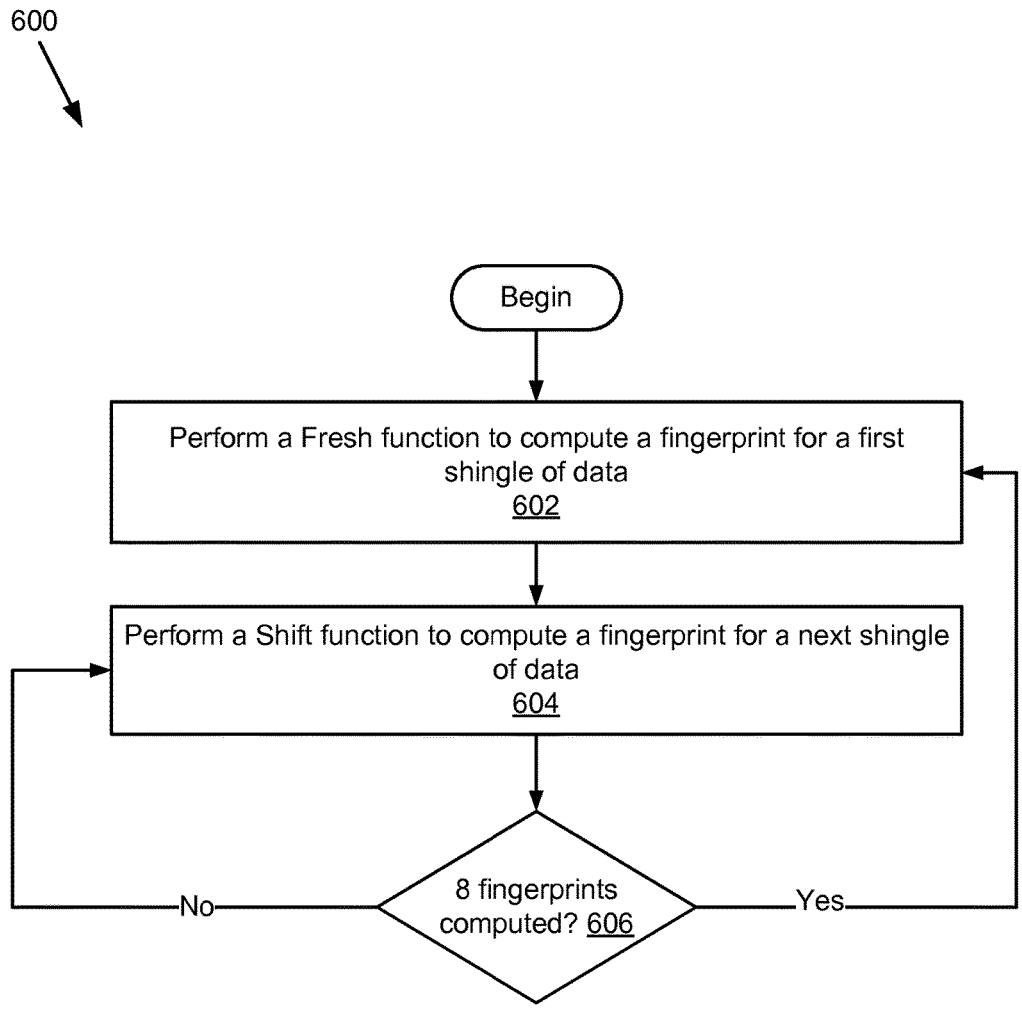
FIG. 6 is a flow chart of an example method for incrementally computing fingerprints, according to the techniques described herein.

FIG. 6 is a flow chart of an example method for incrementally computing fingerprints. At 602, the first stage in the pipeline, the fingerprint module (e.g., fingerprint module 212 or 232) performs a Fresh function, for example to compute a fingerprint out of $(a_0, a_1, \ldots, a_{63})$ as described above. At 604, the fingerprint module performs a Shift function to compute a fingerprint for the next shingle of data, e.g., $(a_8, a_9, \ldots, a_{71})$. The Shift function takes as input the evicted byte from the previous shingle (e.g., the first shingle), the absorbed byte from the end of its own shingle, and the result from the previous shingle (e.g., the first shingle) to produce a fingerprint. For example the Shift function utilizes $(a_0, a_1, \ldots, a_7)$, $(a_{64}, a_{65}, \ldots, a_{71})$, and the fingerprint result from the Fresh function of 602. The process continues until 8 fingerprints have been computed (e.g., the Shift function consumes $(a_{48}, a_{49}, \ldots, a_{55})$, $(a_{112},$ $a_{113}, \ldots, a_{119}$), and the result from the previous Shift function). At 606, if 8 fingerprints have been computed, the entire data from the following shingle, ($a_{64}, a_{65}, \ldots, a_{127}$), is treated by Fresh function at 602. Due to the reuse of previous computations, the complexity of the Shift function is lower than that of the Fresh function and therefore consumes less resources when implemented on hardware.

To improve performance, a single irreducible polynomial may be chosen for which a Rabin fingerprint computation has the least amount of operations for one full computation and seven incremental computations. As described above, incremental computation may allow computation of a fingerprint to reuse calculations from seven out of eight bytes of a previous fingerprint calculation. In one implementation, the irreducible polynomial that has one of the least amount of operations over the Fresh function and the seven Shift functions is $p(X)=X^{16}+X^{13}+X^{12}+X^{11}+1$. For the irreducible polynomial described here, the maximum fan-in is 26, the maximum fan-out is 11, and the total number of XORs is 1153.

Figure 7:
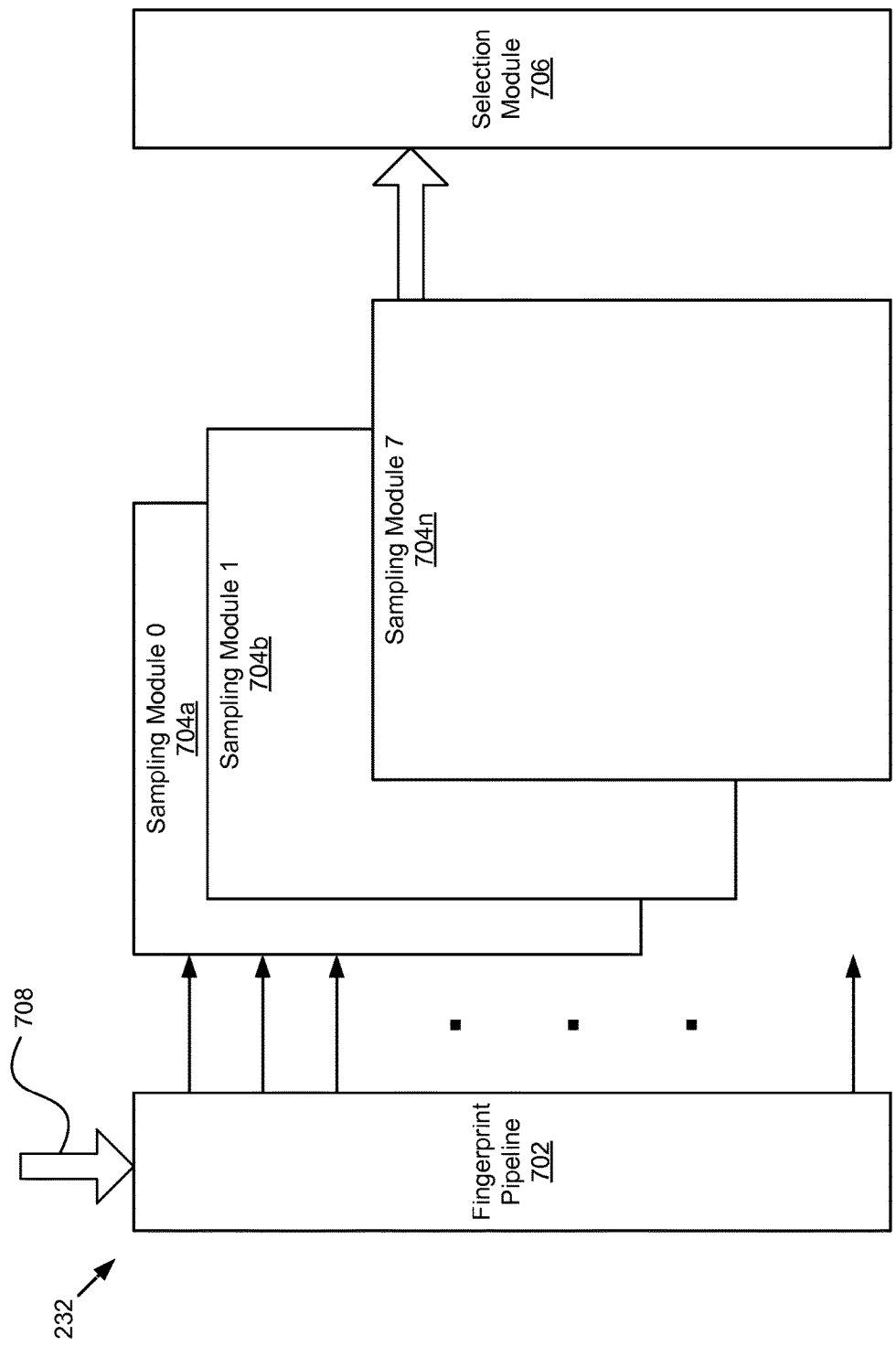
FIG. 7 is a block diagram illustrating an example fingerprint module, according to the techniques described herein.

FIG. 7 is a block diagram illustrating an example fingerprint module 232. The example fingerprint module 232 includes a fingerprint pipeline 702, a number of sampling modules 704a-704n, and a fingerprint selection module 706. In the example single pipeline design depicted in FIG. 7, data 708 flows from top to bottom through the fingerprint pipeline. The total number of fingerprints generated for a w-byte data chunk according to the techniques disclose here is w−b+1, where b is the size of the shingles. In some embodiments, to reduce the number of fingerprints compared by the deduplication modules, several fingerprints may be chosen from among all of the fingerprints as a sketch to represent the data chunk. In one embodiment, fingerprints with upper N bits having a specific pattern are selected for the sketch since these upper bits in each fingerprint can be considered as randomly distributed. The result of this selection is a good choice in terms of balancing processing speed, similarity detection, elimination of false positives, and resolution.

Fingerprint results produced at every pipeline stage are sent to the right for the corresponding channel sampling modules to process. As the data chunk runs through the pipeline, the fingerprints are sampled and stored in an intermediate buffer (shown in FIG. 9). After the sampling for a data chunk is done, the fingerprint selection module will choose from the intermediate samples and returns a sketch for the data chunk. In some embodiments, the pipeline is composed of one Fresh function and several following Shift functions, it may very well be that picking a costly Fresh function works better for the whole design in terms of resource utilization. This possibility is due to the likelihood a more cost-efficient Shift function may be obtained in the situation. However, a costly Fresh function may adversely affect the clock rate of the pipeline.

In general, it is desirable to have similar design complexity among all of the stages of a pipelined architecture. As described above with reference to the Shift function, the Fresh function can also be split into multiple Fresh functions. For example, using the same example from the above, the Fresh function can be partitioned into two modules, named Fresh1 and Fresh2 here. Fresh1 treats ($a_0, a_1, \ldots, a_{38}$) in FIG. 6, while Fresh2 treats ($a_{39}, a_{40}, \ldots, a_{63}$). Since Fresh2 also takes the result from Fresh1 as input, the partition of the original Fresh may not be an even split. For example, a suitable partition can be had when Fresh1 treats the first 39 bits and Fresh2 the remaining 25 bits.

Table 1 lists the complexity of the individual split Fresh modules, the combined of the two, and that of the original single Fresh function. While the resource consumption does not change much with the split Fresh modules, the clock rate improves for the split Fresh design.

TABLE 1

| Logic Utilization | Fresh1 | Fresh2 | Split Combined | Original Fresh |
| --- | --- | --- | --- | --- |
| Fan-in | 13 | 11 | 13 | 24 |
| Fan-out | 7 | 9 | 9 | 11 |
| XORs | 139 | 143 | 368 | 362 |
| Maximum clock rate (MHz) | 551 | 542 | 548 | 487 |

Figure 8A:
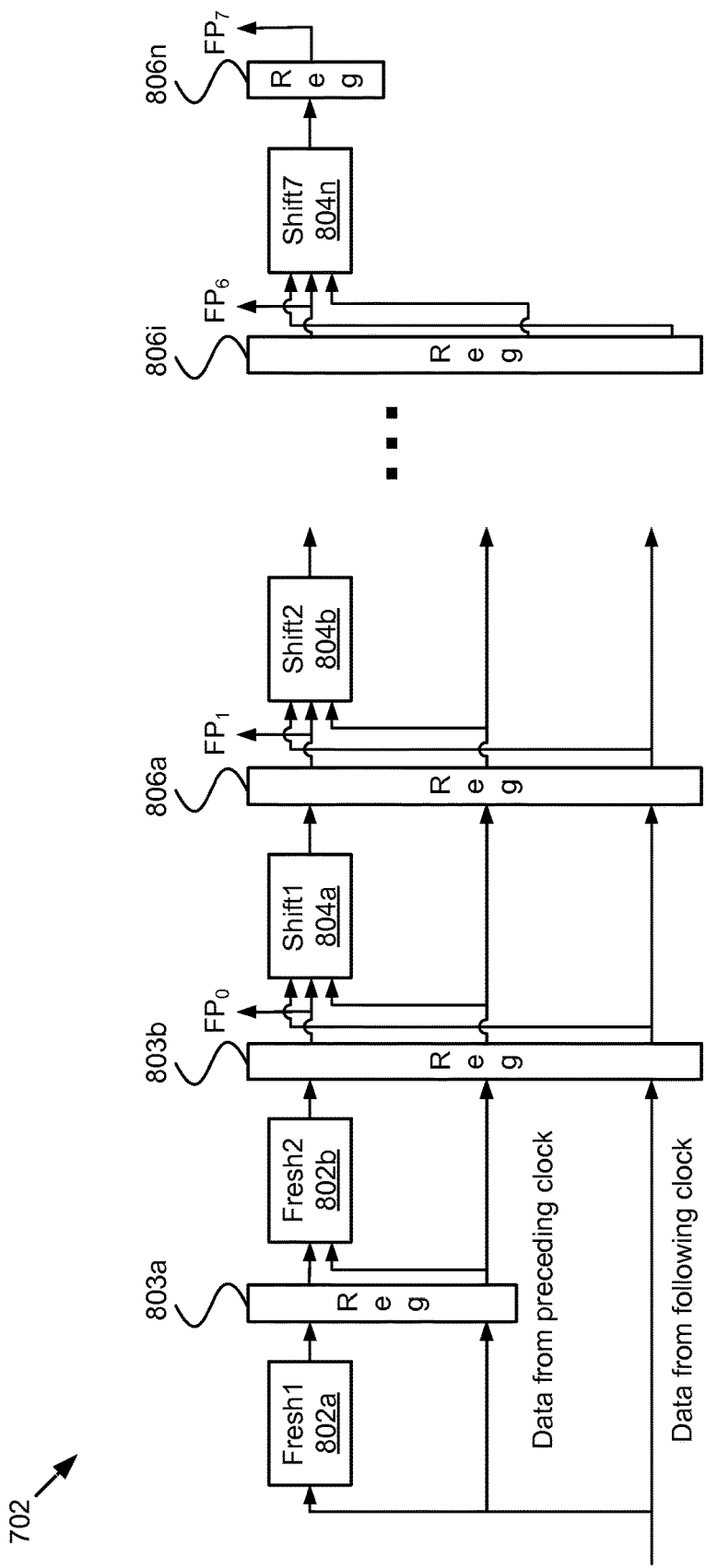
FIG. 8A is a block diagram illustrating an example fingerprint pipeline with split Fresh stages, according to the techniques described herein.

FIG. 8A is a block diagram illustrating an example fingerprint pipeline with split Fresh stages. The example fingerprint pipeline includes two split Fresh stages 802 followed by 7 Shift stages 804 and registers 803a, 803b, and 806a-806n after each stage. Assuming a 64-bit input, the two Fresh modules compute the fingerprint for the 8 bytes of data from the preceding clock. The first 7 bytes from the preceding clock and the first 7 bytes from the following clock are passed via pipeline registers 803a and 803b to Shift1 804a where fingerprints are computed for corresponding shingles. Each stage consumes the result of the previous stage, the evicted byte from the preceding clock, and the absorbed byte from the following clock. After the computation is done, the evicted and absorbed bytes are dropped. Therefore, the pipeline registers decrease by two bytes every step forward, until there is no "evicted" and "absorbed" bytes for processing.

Compared to a pipeline with one Fresh unit, the split Fresh design introduces one more stage in the pipeline resulting in one additional clock cycle to the latency of the final result. However, this split Fresh module makes the processing delays of all stages in the pipeline smaller and uniform. If needed for a higher clock rate, the Fresh and Shift modules can be further split into more stages than two. At steady state, a fingerprint ($FP_n$) is output at every stage to a channel sampling unit, and fingerprint pipeline 702 produces eight fingerprints for every clock cycle.

Figure 8B:
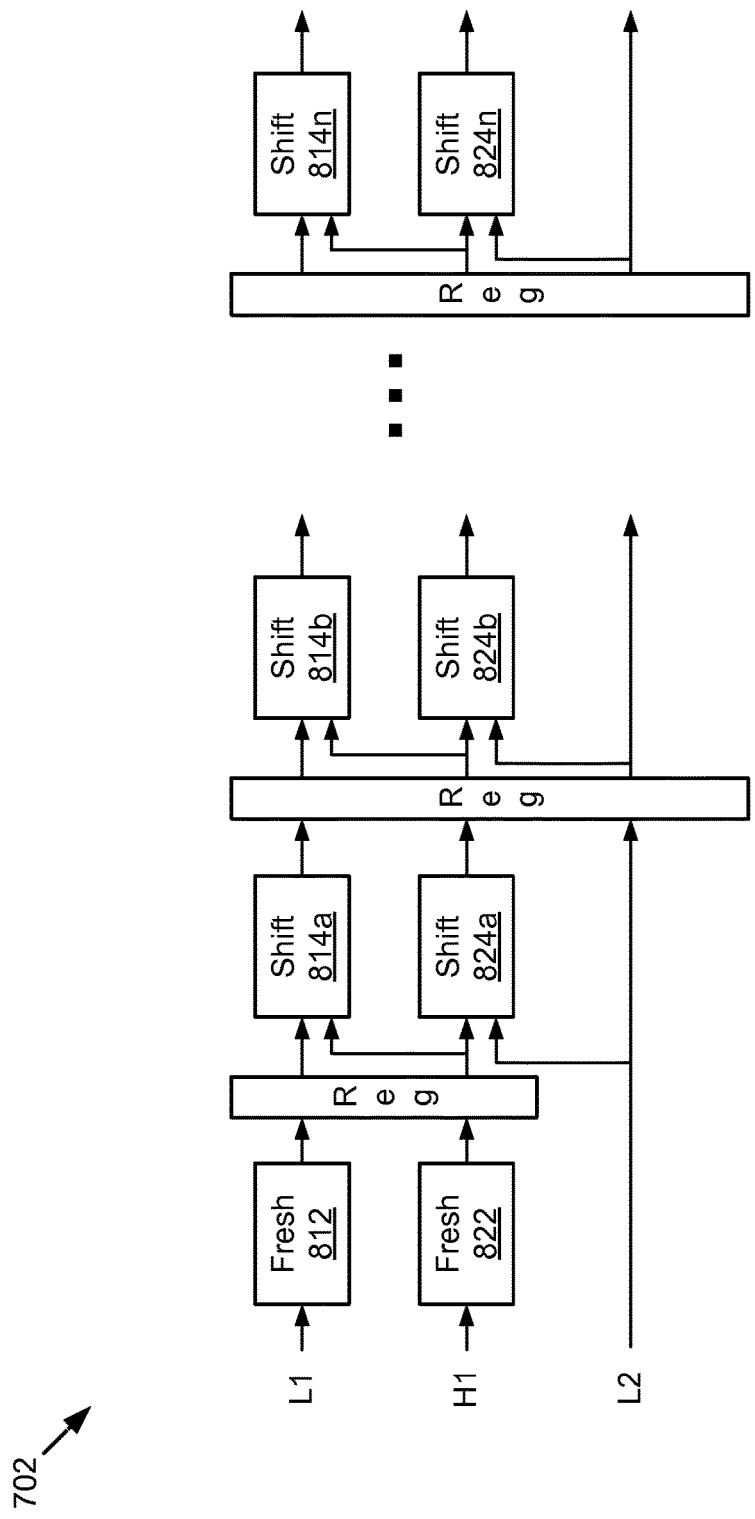
FIG. 8B is a block diagram illustrating an example parallel pipeline, according to the techniques described herein.

FIG. 8B is a block diagram illustrating an example parallel pipeline. The parallel pipeline includes a set of two Fresh functions 812 and 814 and two sets of Shift functions 814a-814n and 824a-824n. When the data bus width exceeds the defined shingle size, multiple pipelines in parallel may be used to produce more fingerprints for one clock cycle. For example, assume the input data comes in at 16 bytes per clock, and the shingle size remains 8 bytes. The data can be divided into low 8 bytes and high 8 bytes, (e.g. L1 and H1). L2 refers to the lower 8 bytes from the following clock. L1, H1, and L2 are fed into the pipelines, where L1 and H1 go through the upper pipeline to produce eight sets of fingerprints, and H1 and L2 go through the lower pipeline number 2 to produce another eight sets of fingerprints. The number of the channel sampling units and the size of fingerprint selection module will increase accordingly, and one more clock latency is incurred every time the number of pipeline stages doubles. However, due to the saving of the registers across the multiple pipelines, the resource consumption for the whole design does not increase linearly.

Figure 9:
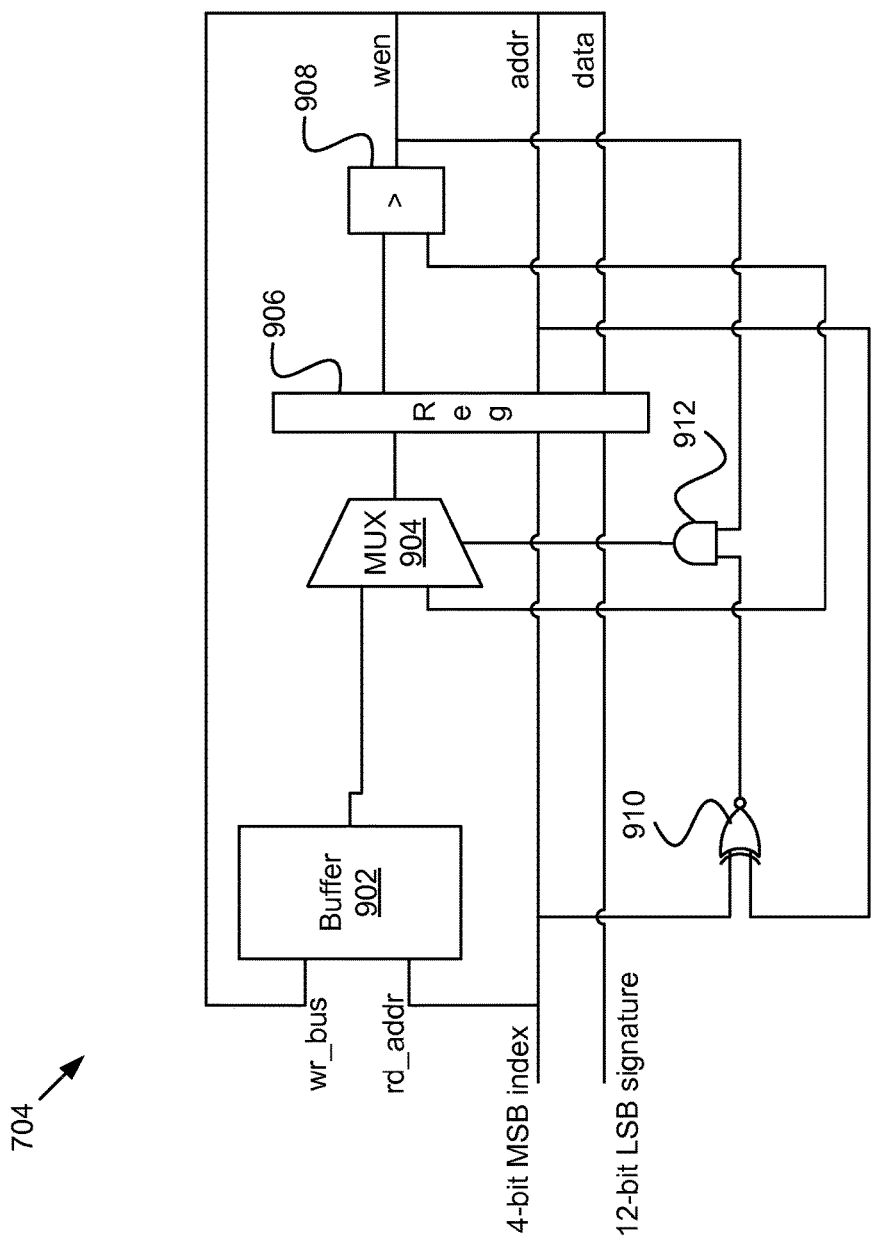
FIG. 9 is a block diagram illustrating an example sampling module, according to the techniques described herein.

FIG. 9 is a block diagram illustrating an example sampling module 704. As described above, each computed fingerprint may be divided into two parts, an index and a signature. The index may include a few of high order bits and the signature the remaining ones. For example, if the index has m bits, the signatures can be categorized into $2^m$ bins. Within a bin, the signatures are selected as one candidate for the final sketch. For each sampling module 704, there can be up to $2^m$ candidates for the final selection.

Continuing the example of 16 fingerprints from above, the sampling module 704 uses four MSBs, i.e. m=4, as an index (e.g., to address the buffer where the selected signatures are stored). The comparator 908 decides whether the minimum or maximum value is sampled into the buffer. The register 906 is used to buffer the incoming signature to compare with the buffer output from the same bin. The wr_bus carries the write enable (wen), the write address (addr), and the data to write (data).

When the buffer read address equals to the buffer write address, a read-after-write (RAW) hazard may occur. To avoid the RAW hazard, a data forwarding unit is designed to control which value to compare with the incoming signature. The XNOR gate 910 checks whether the read address and the write address clash. If they do, and the write enable is active at the moment, the current write value will be forwarded to the comparator. This forwarding is done by the MUX 904 controlled by the output of the AND gate 912. At the end of the channel sampling, each buffer is loaded with candidate signatures for all indices, some of which can be "0" if no index for the buffer entry ever appeared.

Figure 10:
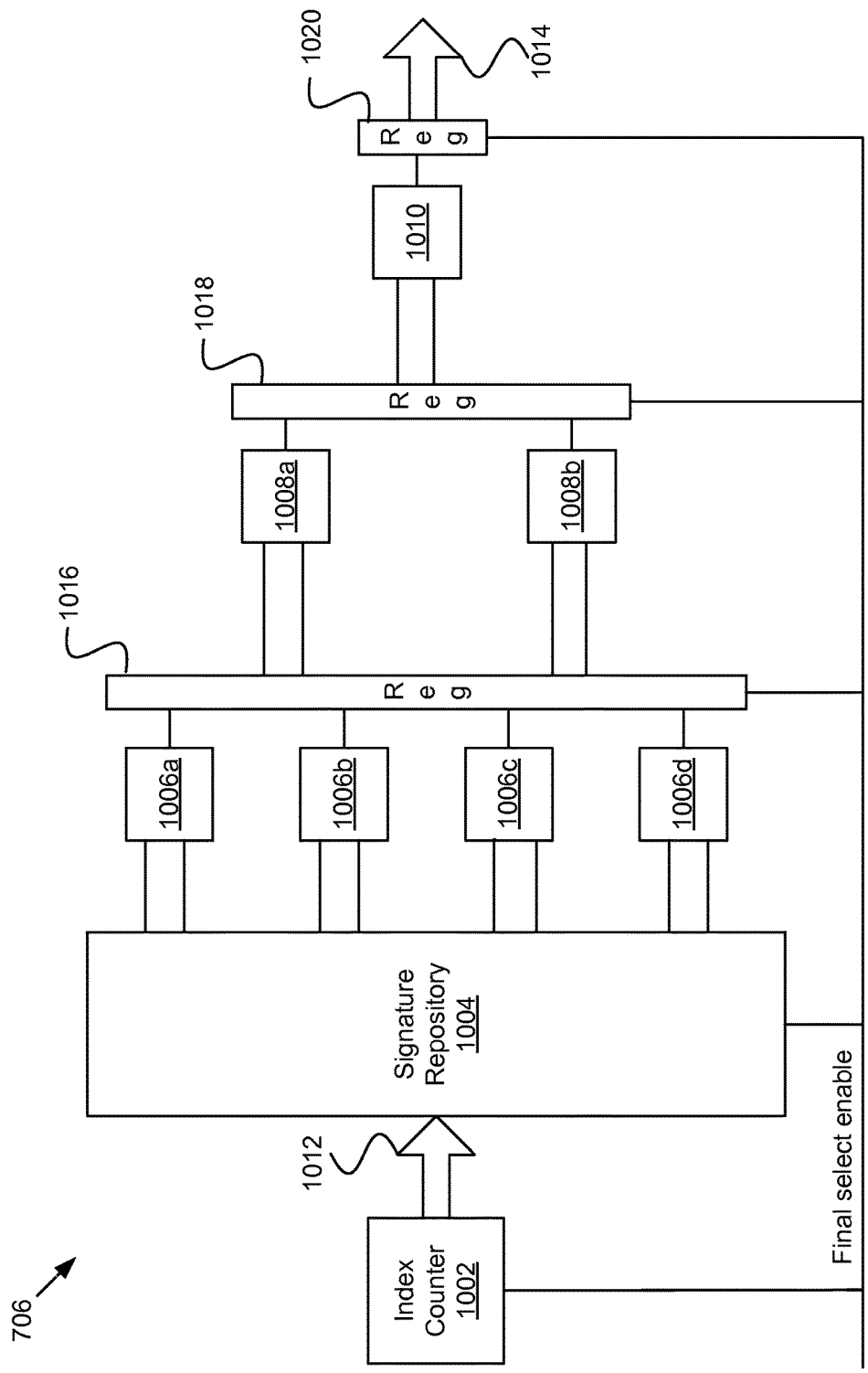
FIG. 10 is a block diagram illustrating an example fingerprint selection module, according to the techniques described herein.

FIG. 10 is a block diagram illustrating an example fingerprint selection module 706. When all signatures are settled in the buffer of the channel sampling module, the fingerprint selection module 706 can start to select the signatures to create a sketch of the data chunk. According to Manber's theory, the number of signatures in a sketch may be dependent on the size of the data chunk. In one example embodiment, the fingerprint selection module selects eight signatures out of 16 possible ones. For example, the fingerprint selection module 706 may select indices are 0, 1, 3, 5, 7, 11, 13, and 15, although any subset of signatures may be selected.

Taking advantage of eight concurrently available channel buffers in the signature repository 1004 (e.g., the buffers of the eight channel sampling modules), the fingerprint selection module 706 uses a tree of comparators 1006, 1008 and 1010 to select the fingerprints for the sketch. Adding registers 1016 and 1018 between each level of the tree makes a pipelined fingerprint selection design. The index counter 1002 allows flexibly selecting signatures. For example, the index counter reads out 0, 1, 3, 5, 7, 11, 13, and 15, one at each clock cycle. The readout 1012 serves as the read address to all 8 channel buffers. The signature 1014 for an index returns at the end of the tree.

Systems and methods for implementing a pipelined hardware architecture for computing fingerprints on high throughput streaming data are described below. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to user interfaces and particular hardware. Moreover, the technologies disclosed above primarily in the context of on line services; however, the disclosed technologies apply to other data sources and other data types (e.g., collections of other resources for example images, audio, web pages).

Reference in the specification to "one implementation" or "an implementation" means that a particular feature, structure, or characteristic described in connection with the implementation is included in at least one implementation of the disclosed technologies. The appearances of the phrase "in one implementation" in various places in the specification are not necessarily all referring to the same implementation.

Some portions of the detailed descriptions above were presented in terms of processes and symbolic representations of operations on data bits within a computer memory. A process can generally be considered a self-consistent sequence of steps leading to a result. The steps may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory or any type of media suitable for storing electronic instructions, each coupled to a computer system bus.

The disclosed technologies can take the form of an entirely hardware implementation, an entirely software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Finally, the processes and displays presented herein may not be inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A system comprising:
   a fingerprint pipeline configured to compute fingerprints for a data chunk, the fingerprint pipeline comprising:
   a Fresh module configured to:
     split a first shingle of data from the data chunk into a plurality of portions;
     perform a first Fresh function on a first portion of the plurality of portions; and
     perform a second Fresh function on a second portion of the plurality of portions using a result of the first Fresh function to compute a first fingerprint from the first shingle of data from the data chunk;
   a first Shift module communicatively coupled with an output of the Fresh module, wherein the first Shift module is configured to compute a second fingerprint using the first fingerprint, the first shingle of data from the data chunk, and a second shingle of data from the data chunk;
   a plurality of sampling modules communicatively coupled with the fingerprint pipeline, the plurality of sampling modules configured to sample candidate fingerprints for generating a sketch for the data chunk; and
   a fingerprint selection module communicatively coupled with the plurality of sampling modules, the fingerprint selection module configured to select a plurality of fingerprints to create a sketch of the data chunk.

2. The system of claim 1, wherein the fingerprint pipeline further comprises:
   a second Shift module communicatively coupled with an output of the first Shift module, wherein the second Shift module is configured to compute a third fingerprint using the second fingerprint, the second shingle of data from the data chunk, and a third shingle of data from the data chunk.

3. The system of claim 1, wherein the fingerprint pipeline further comprises:
   a plurality of pipelines operating in parallel.

4. The system of claim 1, wherein one or more of the fingerprint pipeline, the plurality of sampling modules, and the fingerprint selection module are implemented using a field programmable gate array.

5. The system of claim 1, further comprising a deduplication module coupled with the fingerprint selection module, the deduplication module configured to use the sketch of the data chunk to compress storage of the data chunk.

6. The system of claim 1, further comprising:
   a non-volatile memory express (NVMe) controller, wherein the NVMe controller includes one or more of the fingerprint pipeline, the plurality of sampling modules, and the fingerprint selection module.

7. The system of claim 1, wherein the fingerprints for the data chunk data are Rabin fingerprints based on an irreducible polynomial.

8. A method comprising:
   receiving a data chunk including a plurality of shingles of data;
   performing a Fresh function to compute a first fingerprint for a first shingle of data of the plurality of shingles of data k
     splitting the first shingle of data into a plurality of portions;
     performing a first Fresh function on a first portion of the plurality of portions; and
     performing a second Fresh function on a second portion of the plurality of portions using a result of the first Fresh function; and
   performing a Shift function to compute a second fingerprint for a second shingle of data of the plurality of shingles of data, wherein the Shift function uses the first fingerprint for the first shingle of data as an input.

9. The method of claim 8, further comprising:
   performing a plurality of Shift functions to compute a plurality of fingerprints for the plurality of shingles of data, wherein each of the plurality Shift functions uses a fingerprint for a preceding shingle of data, a preceding shingle of data, and a current shingle of data as inputs.

10. The method of claim 9, further comprising:
sampling the plurality of fingerprints;
selecting a subset of the plurality of fingerprints; and
creating a sketch of the data chunk including the plurality of shingles of data, wherein the sketch of the data chunk comprises the subset of the plurality of fingerprints.

11. The method of claim 10, further comprising using the sketch of the data chunk to compress storage of the data chunk.

12. The method of claim 8, wherein the first fingerprint for the first shingle of data and the second fingerprint for the second shingle of data are Rabin fingerprints based on an irreducible polynomial.

13. The method of claim 12, further comprising:
selecting the irreducible polynomial to minimize computations over the Fresh and Shift functions.

14. A method comprising:
performing a plurality of Fresh functions in parallel to compute a first plurality of fingerprints for a first shingle of data, wherein each Fresh function comprises:
splitting the first shingle of data into a plurality of portions;
performing a first Fresh function on a first portion of the plurality of portions; and
performing a second Fresh function on a second portion of the plurality of portions using a result of the first Fresh function; and
performing a first plurality of Shift functions in parallel to compute a second plurality of fingerprints for a second shingle of data, wherein the first plurality of Shift functions use the first plurality of fingerprints for the first shingle of data, a plurality of portions of the first shingle of data, and a plurality of portions of the second shingle of data as inputs.

15. The method of claim 14, further comprising:
performing a second plurality of Shift functions in parallel to compute a third plurality of fingerprints for a third shingle of data, wherein each of the plurality Shift functions uses the second plurality of fingerprints for the second shingle of data, a plurality of portions of the second shingle of data, and a plurality of portions of the third shingle of data as inputs.

16. The method of claim 15, further comprising:
sampling the first plurality of fingerprints, the second plurality of fingerprints, and the third plurality of fingerprints;
selecting a subset of the first plurality of fingerprints, the second plurality of fingerprints, and the third plurality of fingerprints; and
creating a sketch of a data chunk including a plurality of data shingles, wherein the sketch of the data chunk comprises the subset of the first plurality of fingerprints, the second plurality of fingerprints, and the third plurality of fingerprints.

17. The method of claim 16, further comprising using the sketch of the data chunk to compress storage of the data chunk.

18. The method of claim 14, wherein the first plurality of fingerprints for the first shingle of data and the second plurality of fingerprints for the second shingle of data are Rabin fingerprints based on an irreducible polynomial.

* * * * *